(12) United States Patent
Kamijima

(10) Patent No.: US 6,872,579 B2
(45) Date of Patent: Mar. 29, 2005

(54) THIN-FILM COIL AND METHOD OF FORMING SAME

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/614,882

(22) Filed: Jul. 9, 2003

(65) Prior Publication Data

US 2004/0018726 A1 Jan. 29, 2004

(30) Foreign Application Priority Data

Jul. 24, 2002 (JP) ........................................ 2002-214971

(51) Int. Cl.[7] .......................... H01L 39/00; H01L 21/76
(52) U.S. Cl. .......................... 438/3; 438/238; 438/381; 438/669; 438/670; 438/671; 257/421; 257/531; 257/528
(58) Field of Search ........................ 438/3, 238, 381, 438/669–671; 257/421, 528, 531, 735–736, 748, 758, 780–781

(56) References Cited

U.S. PATENT DOCUMENTS

| | | | |
|---|---|---|---|
| 3,853,715 A | | 12/1974 | Romankiw |
| 5,824,599 A | * | 10/1998 | Schacham-Diamand et al. . 438/678 |
| 5,976,967 A | * | 11/1999 | Wu ............................. 438/618 |
| 6,081,021 A | * | 6/2000 | Gambino et al. ........... 257/530 |
| 6,143,641 A | * | 11/2000 | Kitch ......................... 438/618 |
| 6,245,670 B1 | * | 6/2001 | Cheung et al. ............. 438/637 |
| 6,252,290 B1 | * | 6/2001 | Quek et al. ................. 257/522 |
| 6,255,217 B1 | * | 7/2001 | Agnello et al. ............. 438/687 |
| 6,261,950 B1 | * | 7/2001 | Tobben et al. .............. 438/641 |
| 6,284,642 B1 | * | 9/2001 | Liu et al. .................... 438/622 |
| 6,287,961 B1 | * | 9/2001 | Liu et al. .................... 438/638 |
| 6,329,211 B1 | * | 12/2001 | Terunuma et al. ............. 438/3 |
| 6,333,557 B1 | * | 12/2001 | Sullivan ..................... 257/758 |
| 6,372,661 B1 | * | 4/2002 | Lin et al. .................... 438/769 |
| 6,558,516 B1 | * | 5/2003 | Kamijima ................. 204/192.2 |
| 6,611,035 B2 | * | 8/2003 | Inoue ......................... 257/421 |
| 6,673,633 B2 | * | 1/2004 | Sasaki ............................ 438/3 |
| 6,771,463 B2 | * | 8/2004 | Kamijima ................... 360/123 |
| 6,780,738 B2 | * | 8/2004 | Kamijima ................... 438/579 |
| 6,812,543 B2 | * | 11/2004 | Kamijima ................... 257/531 |
| 2002/0109168 A1 | * | 8/2002 | Kim et al. .................. 257/295 |

FOREIGN PATENT DOCUMENTS

| | | | |
|---|---|---|---|
| JP | B-56-36706 | 8/1981 | |
| JP | 02123511 | * 5/1990 | ............. 174/137 R |
| JP | A-8-330736 | 12/1996 | |

* cited by examiner

*Primary Examiner*—Lynne A. Gurley
(74) *Attorney, Agent, or Firm*—Oliff & Berridge, PLC

(57) ABSTRACT

A method of forming a patterned thin film comprises the steps of forming a first plating layer and a second plating layer. Each of the steps of forming the plating layers includes: the step of forming a coating film by applying a liquid resist to the layer below; the heat processing step of forming a resist layer by performing heat processing on the coating film; the step of forming a frame by patterning the resist layer; and the step of forming the plating layer by plating through the use of the frame. Each of sublayers includes: a first portion having a sidewall and encased in a groove of the frame; and the second portion extending out of the groove. The second portion has overhang portions that overhang and extend more outward than the sidewall of the first portion.

4 Claims, 9 Drawing Sheets

THIN-FILM COIL AND METHOD OF FORMING SAME

BACKGROUND OF THE INVENTION

1. Field of the Invention

The present invention relates to a patterned thin film containing a plurality of stacked sublayers and a method of forming the same.

2. Description of the Related Art

Frame plating is one of the methods of forming a thin film that is patterned (referred to as patterned thin film in the present patent application), such as the method disclosed in Published Examined Japanese Patent Application Showa 56-36706 (1981). To perform the frame plating disclosed, an electrode film is formed on a substrate, for example, and a resist layer is formed on the electrode film. The resist layer is patterned by photolithography to form a frame to be used for plating. Electroplating is then performed through the use of the frame with the electrode film already formed as an electrode and a seed layer, so as to form a patterned thin film.

A patterned thin film formed by frame plating may be utilized in microdevices, for example. Such microdevices include a thin-film inductor, a thin-film magnetic head, a semiconductor device, a sensor incorporating thin films, and an actuator incorporating thin films. In such applications a patterned thin film that is small in width and great in thickness may be required in some cases in order to increase the integration of a microdevice, for example.

Consideration will now be given to a case in which frame plating is utilized to form the above-mentioned patterned thin film that is small in width and great in thickness. If a single-layer frame is used to form the patterned thin film in this case, it is required to make a frame that has a great thickness and a groove with a reduced width. However, it is very difficult to make such a frame with accuracy.

To solve this problem, a method is disclosed in Published Unexamined Japanese Patent Application Heisei 8-330736 (1996) to form a patterned thin film by stacking two or more plating layers. In this method an electrode film is first formed on a substrate, for example, and a first resist layer is formed on the electrode layer. The first resist layer is patterned by photolithography to form a first frame. Next, an electric current is fed to the electrode film to perform electroplating through the use of the first frame to form a first plating layer. The first frame is then hard-baked, without peeling off the first frame. Next, a second resist layer is formed on the first frame and the first plating layer. The second resist layer is patterned by photolithography to form a second frame. A current is fed to the electrode film used for making the first plating layer, so as to perform electroplating through the use of the second frame to form a second plating layer. The second plating layer is stacked on the first plating layer. Next, the first and second frames are peeled off through the use of an organic solvent. Finally, portions of the electrode film except the portion below the first plating layer are removed by wet etching or dry etching.

Alternatively, another plating layer or more may be stacked on the second plating layer through a step similar to the step of forming the second plating layer on the first plating layer. It is acceptable that the second plating layer and the plating layers above are in contact with at least part of the plating layer located directly below. It is also acceptable that two overlapping plating layers have different patterns.

In the above-described method of forming the patterned thin film, if each of the resist layers is made through the use of a liquid resist, after the liquid resist is applied to form a coating film, heat processing, that is, prebaking of the coating film is required to evaporate the solvent contained in the coating film and to enhance the intimate contact between the coating film and the layer below.

However, it has been found that the following problem arises when each of the resist layers is made through the use of a liquid resist. When prebaking is performed to form the second resist layer and the resist layers above, the coating film provided for the resist layer to be formed, or the resist layer (the frame) below the coating layer form foams. As a result, it is difficult to make the resist layer to be formed without defects.

The above-mentioned Published Unexamined Japanese Patent Application Heisei 8-330736 discloses the method of forming the first and second resist layers through the use of a dry film photoresist. The abovementioned foaming when prebaking is performed will not occur if the resist layers are made of the dry film photoresist. However, the resist layers made of the dry film photoresist exhibit a lower resolution than resist layers made of a liquid resist. It is therefore difficult to form a fine patterned thin film when the resist layers are made of the dry film photoresist.

OBJECTS AND SUMMARY OF THE INVENTION

It is a first object of the invention to provide a method of forming a patterned thin film through the use of frame plating to form the patterned thin film that is small in width and great in thickness.

It is a second object of the invention to provide a patterned thin film that is formed through the use of frame plating to be small in width and great in thickness.

A method of the invention is provided for forming a patterned thin film containing stacked sublayers whose number is M where M is an integer that is two or greater. The method comprises the steps of forming the respective sublayers by frame plating from a first sublayer to an $M^{th}$ sublayer one by one. Each of the steps includes: the step of forming a coating film by applying a liquid resist to the layer below; the heat processing step of forming a resist layer by performing heat processing on the coating film; the step of forming a frame having a groove by patterning the resist layer; and the plating step of forming each of the sublayers by plating through the use of the frame. In the plating step of the step of forming an $N^{th}$ sublayer where N is an integer that is one or greater, and is (M−1) or smaller, the sublayer is formed to include: a first portion having a sidewall and encased in the groove; and a second portion extending out of the groove and coupled to the first portion. The second portion has overhang portions that overhang and extend more outward than the sidewall of the first portion.

According to the method of forming the patterned thin film of the invention, the $N^{th}$ sublayer is formed to include: the first portion having the sidewall and encased in the groove of the frame; and the second portion coupled to the first portion and extending out of the groove. The second portion has the overhang portions that overhang and extend more outward than the sidewall of the first portion. As a result, according to the invention, it is possible to prevent the coating film or the frame therebelow from forming foams during the heat processing step of the step of forming the $(N+1)^{th}$ sublayer.

According to the method of the invention, the sublayer may be formed such that adjacent ones of the overhang portions are kept from being in contact with each other in the plating step of the step of forming the $N^{th}$ sublayer.

According to the method of the invention, the sublayer may be formed such that adjacent ones of the overhang portions are in contact with each other in the plating step of the step of forming the $N^{th}$ sublayer. In addition, the step of forming the $N^{th}$ sublayer may further include the step of removing at least part of the overhang portions by etching so that adjacent ones of the overhang portions are separated from each other after the plating step.

A patterned thin film of the invention comprises sublayers whose number is M where M is an integer that is two or greater, the sublayers being stacked one by one from a first sublayer to an $M^{th}$ sublayer. An $N^{th}$ sublayer, where N is an integer that is one or greater, and is (M−1) or smaller, includes: a first portion having a sidewall; and a second portion coupled to an end of the first portion near an $(N+1)^{th}$ sublayer. The second portion includes overhang portions that overhang and extend more outward than the sidewall of the first portion.

According to the patterned thin film of the invention, the $N^{th}$ sublayer includes the first portion having the sidewall and the second portion coupled to an end of the first portion near the $(N+1)^{th}$ sublayer. The second portion has the overhang portions that overhang and extend more outward than the sidewall of the first portion. As a result, according to the invention, it is possible to make the resist layer without defects that is used for forming the $(N+1)^{th}$ sublayer through the use of frame plating.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

[First Embodiment]

Figure 1:
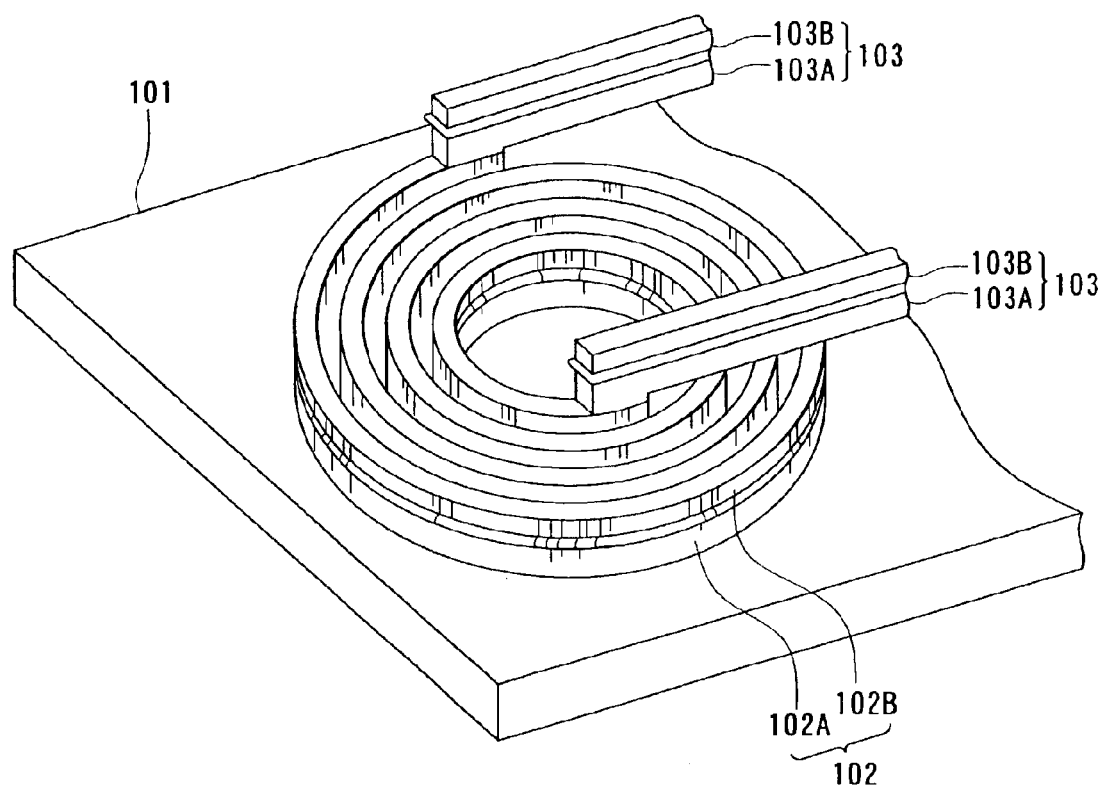
FIG. 1 is a perspective view of a thin-film inductor as an example of a microdevice to which a method of forming a patterned thin film of a first embodiment of the invention is applied.

Reference is now made to FIG. 1 to describe a thin-film inductor as an example of a microdevice to which a method of forming a patterned thin film of a first embodiment of the invention is applied. FIG. 1 is a perspective view of the thin-film inductor of the embodiment.

The thin-film inductor of FIG. 1 comprises: a substrate 101; a thin-film coil 102 formed on the substrate 101; and two leads 103 connected to ends of the thin-film coil 102, respectively.

The thin-film coil 102 incorporates two stacked layers that are sublayers 102A and 102B each of which is formed by frame plating. The thin-film coil 102 corresponds to the patterned thin film of the first embodiment.

In the example shown in FIG. 1 each of the leads 103 also incorporates two stacked layers that are sublayers 103A and 103B each of which is formed by frame plating. Therefore, the leads 103 correspond to the patterned thin film of the embodiment, too. It is not necessary that each of the leads 103 incorporates the two sublayers 103A and 103B, but may be made up of a single layer.

Figure 2:
FIG. 2 is a cross section for illustrating a step in the method of forming the patterned thin film of the first embodiment of the invention.

Reference is now made to FIG. 2 to FIG. 12 to give a detailed description of the patterned thin film and the method of forming the same of the embodiment. According to the method, as shown in FIG. 2, an electrode film 2 is formed by sputtering, for example, on a substrate 1. The substrate 1 may be made of a semiconductor such as silicon (Si), or a ceramic such as aluminum oxide and titanium carbide ($Al_2O_3$—TiC), or a resin such as polyethylene terephthalate. The electrode film 2 is made of a conductive material such as a metal. The electrode film 2 is preferably made of a material having a composition the same as that of a material of which the sublayers to be formed on the electrode film 2 are made. The electrode film 2 may be made up of a single layer or a plurality of layers, and made of copper (Cu), for example.

Figure 3:
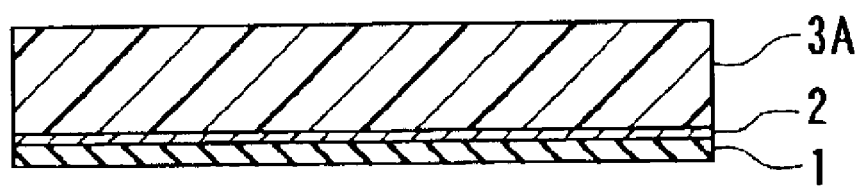
FIG. 3 is a cross section for illustrating a step that follows FIG. 2.

FIG. 3 illustrates the following step. In the step a liquid resist is applied by spin-coating, for example, to the electrode film 2 to be the base of the patterned thin film. A coating film 3A is thereby formed. The liquid resist may be either positive or negative.

Figure 4:
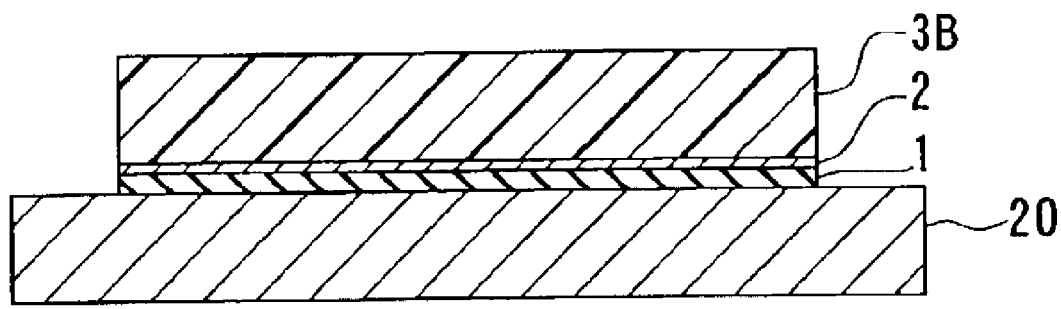
FIG. 4 is a cross section for illustrating a step that follows FIG. 3.

FIG. 4 illustrates the following step. In the step, to evaporate the solvent contained in the coating film 3A and to enhance the intimate contact between the coating film 3A and the layer below, heat processing at a specific temperature for a specific period of time is performed, that is, prebaking is performed on the coating film 3A. A first resist layer 3B is thereby formed. FIG. 4 shows an example in which the above-mentioned heat processing is performed, using a hot plate 20. Alternatively, heat processing may be performed through other methods such as the one using an infrared heater.

Figure 5:
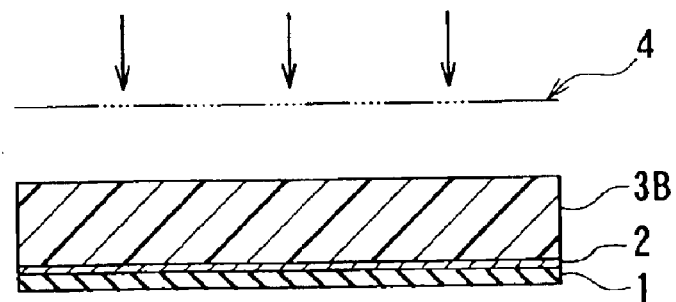
FIG. 5 is a cross section for illustrating a step that follows FIG. 4.

Next, as shown in FIG. 5, the resist layer 3B is exposed through a mask 4 to form a latent image corresponding to the pattern of the mask 4 on the resist layer 3B. Next, heat processing, that is, pre-development baking is performed on the resist layer 3B as required.

Figure 6:
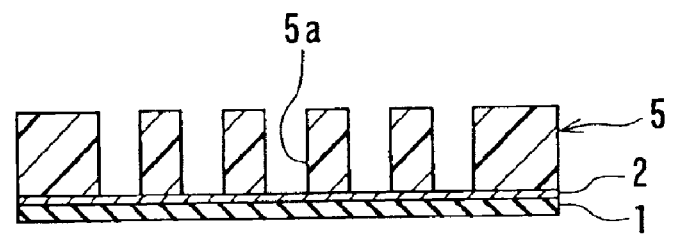
FIG. 6 is a cross section for illustrating a step that follows FIG. 5.

FIG. 6 illustrates the following step. In the step the resist layer 3B is developed with a developer and washed with water and dried. A first frame 5 for forming the first sublayer is thereby formed by the remaining resist layer 3B. The first frame has a groove 5a. FIG. 6 shows an example in which the liquid resist used for making the resist layer 3B is positive, and the portions of the resist layer 3B exposed are thus removed after development.

In such a manner the resist layer 3B is patterned by photolithography and the frame 5 is formed.

Figure 7:
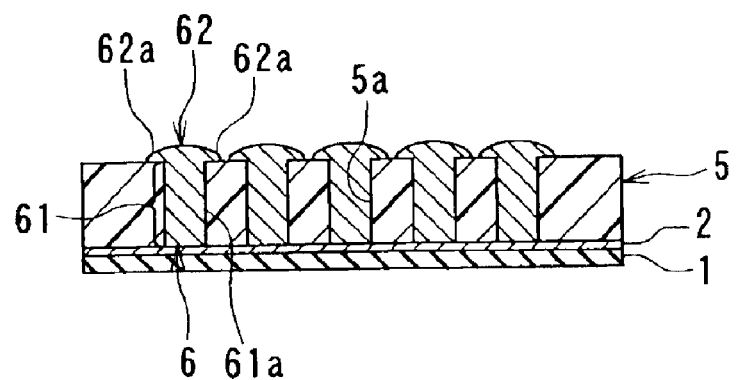
FIG. 7 is a cross section for illustrating a step that follows FIG. 6.

Next, pre-plating processing is performed as required, which is followed by feeding a current to the electrode film 2 to perform electroplating through the use of the frame 5. A first sublayer 6 is thereby formed, as shown in FIG. 7. The sublayer 6 is made of a conductive material such as a metal, and may be made of copper (Cu).

In the step of forming the sublayer 6, the sublayer 6 is formed to have a thickness greater than the thickness of the frame 5, and formed such that portions of the sublayer 6 extend out of the groove 5a and hang over the top surface of the frame 5.

The sublayer 6 includes a first portion 61 and a second portion 62. The first portion 61 is encased in the groove 5a and has a sidewall 61a. The second portion 62 extends out of the groove 5a and is coupled to the first portion 61. The second portion 62 has overhang portions 62a that overhang and extend more outward than the sidewall 61a of the first portion 61. The sublayer 6 has a T-shaped cross section. The lower surfaces of the overhang portions 62a form an angle of 90 degrees or approximately 90 degrees with respect to the sidewall 61a.

According to the embodiment, the sublayer 6 is formed such that adjacent ones of the overhang portions 62a do not touch each other.

Figure 8:
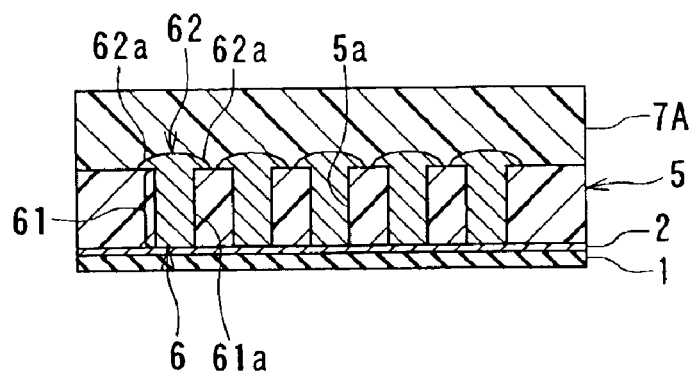
FIG. 8 is a cross section for illustrating a step that follows FIG. 7.

Next, a liquid resist is applied by a method such as spin-coating to the frame 5 and the sublayer 6. A coating film 7A is thereby formed, as shown in FIG. 8. The liquid resist may be either positive or negative. The components (a base resin, a photosensitive material and a solvent) of the liquid resist used for making the coating film 7A may be the same as those of the liquid resist used for making the coating film 3A. Alternatively, some or none of the components may be the same.

Figure 9:
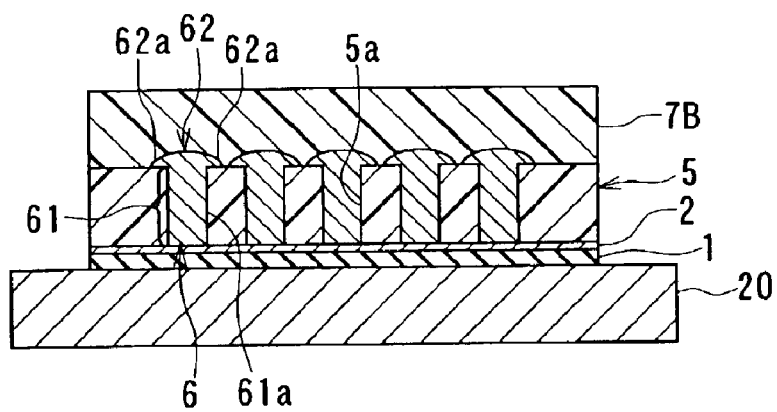
FIG. 9 is a cross section for illustrating a step that follows FIG. 8.

Next, to evaporate the solvent contained in the coating film 7A and to enhance the intimate contact between the coating film 7A and the layer below, heat processing at a specific temperature for a specific period of time is performed, that is, prebaking is performed on the coating film 7A. A second resist layer 7B is thereby formed, as shown in FIG. 9. FIG. 9 shows an example in which the above-mentioned heat processing is performed, using the hot plate 20. Alternatively, heat processing may be performed through other methods such as the one using an infrared heater.

Figure 10:
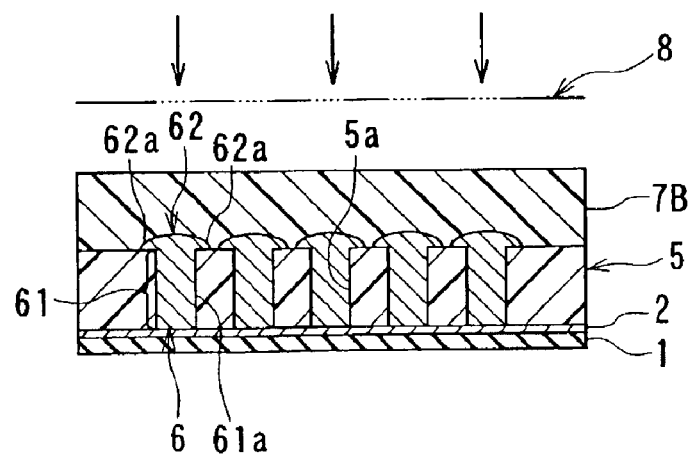
FIG. 10 is a cross section for illustrating a step that follows FIG. 9.

FIG. 10 illustrates the following step. In the step the resist layer 7B is exposed through a mask 8 to form a latent image corresponding to the pattern of the mask 8 on the resist layer 7B. Next, heat processing, that is, pre-development baking is performed on the resist layer 7B as required. It is acceptable that the mask 8 has a pattern that allows a second sublayer that will be formed later to touch at least part of the first sublayer 6. In the example of FIG. 10 the mask 8 has a pattern the same as the pattern of the mask 4.

Figure 11:
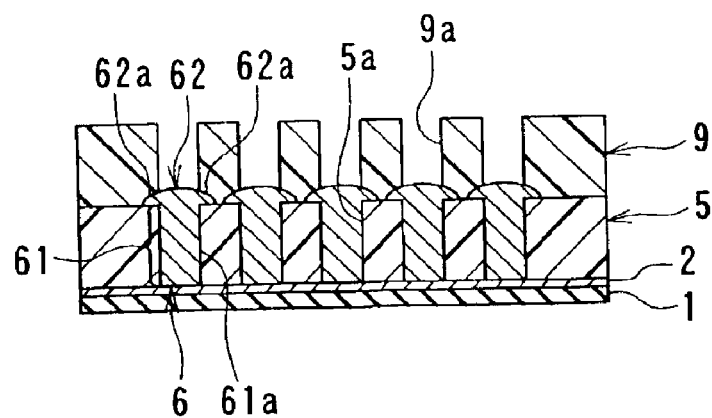
FIG. 11 is a cross section for illustrating a step that follows FIG. 10.

FIG. 11 illustrates the following step. In the step the resist layer 7B is developed with a developer and washed with water and dried. A second frame 9 for forming the second sublayer is thereby made of the remaining resist layer 7B. The frame 9 has a groove 9a. FIG. 11 shows an example in which the liquid resist used for making the resist layer 7B is positive, and the portions of the resist layer 7B exposed are thus removed after development.

In such a manner the resist layer 7B is patterned by photolithography and the frame 9 is formed.

Figure 12:
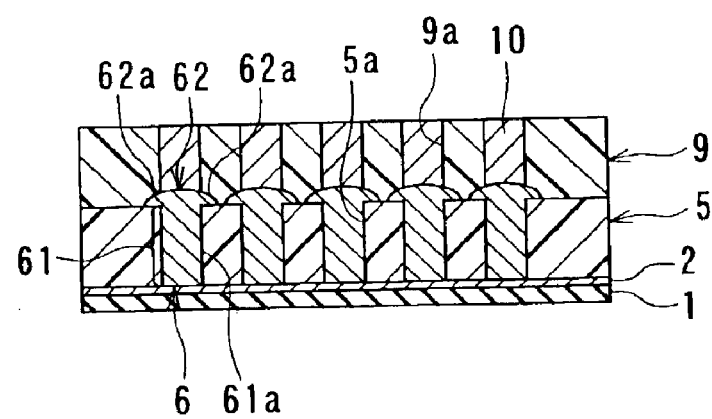
FIG. 12 is a cross section for illustrating a step that follows FIG. 11.

Next, pre-plating processing is performed as required, which is followed by feeding a current to the electrode film 2 to perform electroplating through the use of the frame 9. The second sublayer 10 is thereby formed in the groove 9a of the frame 9, as shown in FIG. 12. The second sublayer 10 is stacked on the second portion 62 of the first sublayer 6. The sublayer 10 is made of a conductive material such as a metal, and may be made of copper (Cu).

In the step of forming the sublayer 10, the sublayer 10 may be formed to have a thickness smaller than or equal to the thickness of the frame 9. Alternatively, the sublayer 10 may be formed to have a thickness greater than the thickness of the frame 9, and formed such that portions of the sublayer 10 extend out of the groove 9a and hang over the top surface of the frame 9, as the sublayer 6 is formed.

Figure 13:
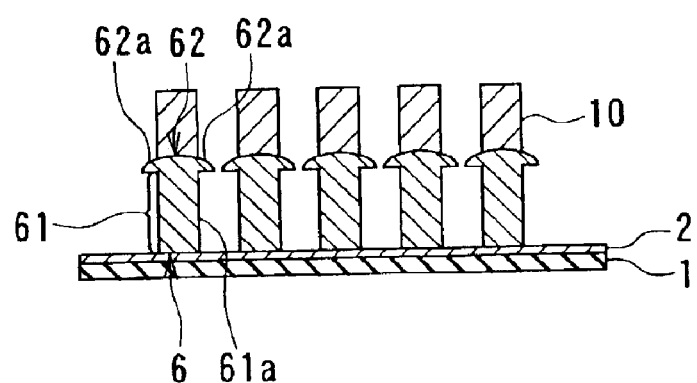
FIG. 13 is a cross section for illustrating a step that follows FIG. 12.

Next, the layered structure of FIG. 12 is soaked in an organic solvent and shaken, for example, so as to dissolve and remove the first frame 5 and the second frame 9, as shown in FIG. 13.

Figure 14:
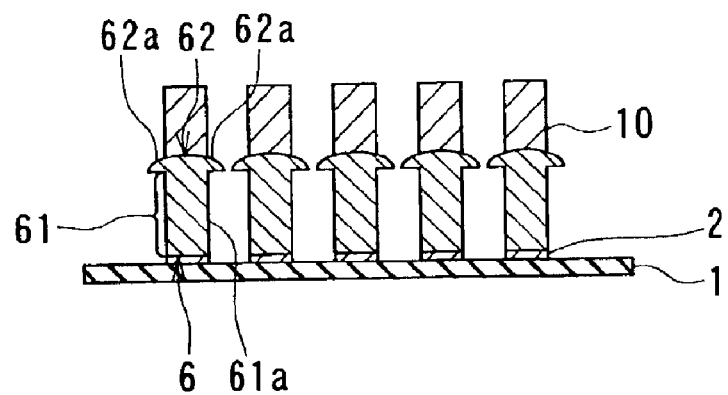
FIG. 14 is a cross section for illustrating a step that follows FIG. 13.

Finally, as shown in FIG. 14, portions of the electrode film 2 except the portion below the first sublayer 6 are removed by wet etching, or dry etching such as ion milling or reactive ion etching, using the sublayers 6 and 10 as masks. The patterned thin film having the stacked two sublayers 6 and 10 each of which is formed by frame plating is thereby formed.

As thus described, the method of forming a patterned thin film of the embodiment comprises the steps of forming the first sublayer 6 by frame plating, and forming the second sublayer 10 on the first sublayer 6 by frame plating.

Each of the steps of forming the sublayers 6 and 10 includes: the step of forming the coating film (3A or 7A) by applying a liquid resist to the layer below; the heat processing step of forming the resist layer (3B or 7B) by performing heat processing on the coating film (3A or 7A) at a specific temperature for a specific period of time; the step of forming the frame (5 or 9) having the groove (5a or 9a) by patterning the resist layer (3B or 7B) through photolithography; and the plating step of forming the sublayer (6 or 10) by plating through the use of the frame (5 or 9).

In the plating step of the step of forming the first sublayer 6, the sublayer 6 is formed to have the first portion 61 and the second portion 62. The first portion 61 is encased in the groove 5a of the frame 5 and has the sidewall 61a. The second portion 62 extends out of the groove 5a and is coupled to the first portion 61. The second portion 62 has the overhang portions 62a that overhang and extend more outward than the sidewall 61a of the first portion 61. According to the embodiment, the sublayer 6 is formed such that adjacent ones of the overhang portions 62a are kept from being in contact with each other.

The patterned thin film of the embodiment comprises the first sublayer 6 and the second sublayer 10 stacked on the sublayer 6. The first sublayer 6 includes: the first portion 61 having the sidewall 61a; and the second portion 62 coupled to an end of the first portion 61 near the second sublayer 10. The second portion 62 have the overhang portions 62a that overhang and extend more outward than the sidewall 61a of the first portion 61. The lower surfaces of the overhang portions 62a form an angle of 90 degrees or approximately 90 degrees with respect to the sidewall 61a.

When each of the resist layers 3B and 7B is formed through the use of a liquid resist, the following problem arises if the first sublayer 6 has only the first portion 61. When heat processing is performed to form the resist layer 7B, the coating film 7A or the frame 5 located below the coating film 7A forms foams. It is therefore difficult to make the resist layer 7B without defects. It is considered that one of the reasons the coating film 7A or the frame 5 forms foams when heat processing is performed to form the resist layer 7B is as follows. After the sublayer 6 is formed, a gap is created between each of the sidewall of the sublayer 6 and the wall of each of the groove 5a of the frame 5, and gas such as air enters the gap. When heat processing is performed to form the resist layer 7B, the gas goes out of the gap, which results in the above-described foams.

According to the embodiment, the first sublayer 6 includes the first portion 61 and the second portion 62, and the second portion 62 has the overhang portions 62a, as described above. The overhang portions 62a prevent gas such as air from entering the gap between the sidewall 61a of the first portion 61 of the sublayer 6 and the wall of the groove 5a of the frame 5. As a result, according to the embodiment, the coating film 7A or the frame 5 is prevented from forming foams when heat processing is performed to make the resist layer 7B. It is thereby possible to form the second resist layer 7B without defects.

According to the embodiment, the resist layers 3B and 7B made of a liquid resist are provided. As a result, the resist layers 3B and 7B having a higher resolution are formed, compared to the case in which the resist layers 3B and 7B are made of a dry film photoresist. It is thus possible to form the fine patterned thin film.

As thus described, the embodiment achieves formation of the patterned thin film that is small in width and great in thickness by frame plating.

An example of the method of forming the patterned thin film of the embodiment will now be described. In this example a silicon substrate having a diameter of 3 inches (76.2 mm) and a thickness of 0.4 mm was utilized as the substrate 1. According to the method of the example, Cu was sputtered on the substrate 1 under the conditions described below, using a sputter, to form the electrode film 2 made of Cu and having a thickness of 100 nm. The sputter was the DC sputter SPF-740H (the product name) manufactured by ANELVA Corporation. The target of the sputter was Cu. The output of the sputter was 1000 W. To the chamber of the sputter an Ar gas was supplied at a flow rate of 50 sccm. The pressure of the Ar gas in the chamber was 2.0 mTorr (approximately 0.266 Pa).

Next, a liquid resist was applied to the electrode film 2 by spin-coating to form the coating film 3A. The resist utilized was the AZP4620 (the product name) manufactured by Clariant Corporation. The thickness of the coating film 3A was 50 $\mu$m.

Next, heat processing was performed on the coating film 3A, using the hot plate 20, to form the resist layer 3B. The heat processing was performed at a temperature of 110° C. for 300 seconds (5 minutes).

Next, the resist layer 3B was exposed through the mask 4, using an exposure apparatus, under the following conditions to form a latent image corresponding to the pattern of the mask 4 on the resist layer 3B. The exposure apparatus utilized was the PLA-501FA (the product name) manufactured by Canon Inc. The mask 4 had a pattern in which a translucent section was 10-turn whorl-shaped, the translucent section and a shade section each had a width of 35 $\mu$m, and the pitch of the translucent section was 70 $\mu$m. The dose was 3000 mJ/cm$^2$. The exposure method was the proximity exposure.

Next, an aqueous solution of KOH whose normality was 0.3 N was utilized as a developer to perform 250-second development on the resist layer 3B ten times by the puddle method. The resist layer 3B was then cleaned with water and dried. The first frame 5 was thus completed.

Next, electroplating was performed, using the frame 5, to form the first sublayer 6 of Cu. A cupric sulfate bath that is typically used for plating of Cu was employed as a plating bath. The sublayer 6 had a thickness of 60 $\mu$m. Portions of the sublayer 6 extended out of the groove 5a and hanged over the top surface of the frame 5.

Next, a liquid resist was applied to the frame 5 and the sublayer 6 by spin-coating to form the coating film 7A. The resist utilized was the AZP4620 (the product name) manufactured by Clariant Corporation. The thickness of the coating film 7A was 50 $\mu$m.

Next, heat processing was performed on the coating film 7A, using the hot plate 20, to form the resist layer 7B. The heat processing was performed at a temperature of 110° C. for 300 seconds (5 minutes).

Next, the resist layer 7B was exposed through the mask 8, using an exposure apparatus, under the following conditions to form a latent image corresponding to the pattern of the mask 8 on the resist layer 7B. The exposure apparatus utilized was the PLA-501FA (the product name) manufactured by Canon Inc. The mask 8 had a pattern in which a translucent section was 10-turn whorl-shaped, the translucent section and a shade section each had a width of 35 $\mu$m, and the pitch of the translucent section was 70 $\mu$m. The dose was 3000 mJ/cm$^2$. The exposure method was the proximity exposure.

Next, an aqueous solution of KOH whose normality was 0.3 N was utilized as a developer to perform 250-second development on the resist layer 7B ten times by the puddle method. The resist layer 7B was then cleaned with water and dried. The second frame 9 was thus completed.

Next, electroplating was performed, using the frame 9, to form the second sublayer 10 of Cu in the groove 9a of the frame 9. A cupric sulfate bath that is typically used for plating of Cu was employed as a plating bath. The sublayer 10 had a thickness of 50 $\mu$m.

Next, the layered structure including the sublayers 6 and 10 was soaked in acetone and shaken to dissolve and remove the frames 5 and 9.

Next, the electrode film 2 was selectively etched under the following conditions, using an ion-milling apparatus, to remove portions of the electrode film 2 except the portion below the first sublayer 6. The ion-milling apparatus utilized was the 8C (the product name) manufactured by Commonwealth Scientific Corporation. The output of the apparatus was 500 W and 500 mA. The pressure in the etching chamber was 3 mTorr (approximately 0.399 Pa). The angle at which ions were applied was 0 degree (the direction of ion application orthogonal to the substrate).

As thus described, a 10-turn thin-film coil that was made up of the sublayers 6 and 10 and that had a pitch of 70 $\mu$m and a thickness of 110 $\mu$m was obtained.

To make a comparison with the above-described example, an experiment was performed under the conditions the same as those of the above-described example, except that the thickness of the sublayer 6 was 50 $\mu$m and the steps up to the step of performing heat processing on the coating film 7A were carried out. In the experiment the coating film 7A formed foams when heat processing was performed on the coating film 7A, and it was impossible to make the resist layer 7B capable of being patterned.

[Second Embodiment]

Reference is now made to FIG. 15 to FIG. 23 to describe a patterned thin film and a method of forming the same of a second embodiment of the invention.

Figure 15:
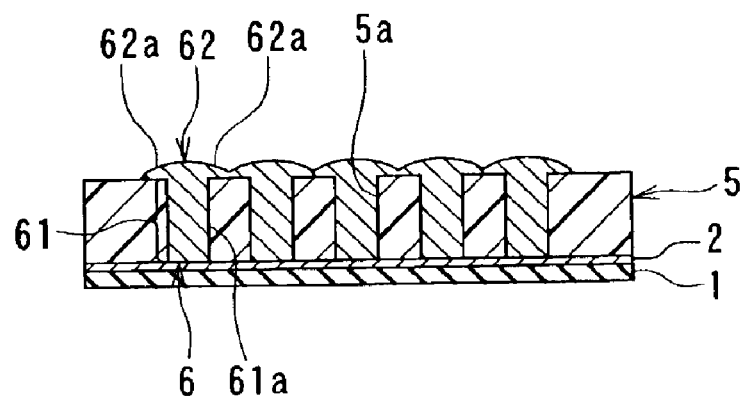
FIG. 15 is a cross section for illustrating a step in a method of forming a patterned thin film of a second embodiment of the invention.

The method of the second embodiment includes the steps up to the step of forming the first frame 5 illustrated in FIG. 6 that are the same as those of the first embodiment. In the following step of the second embodiment pre-plating processing is performed as required, which is followed by feeding a current to the electrode film 2 to perform electroplating, using the frame 5, to form the first sublayer 6, as shown in FIG. 15. The sublayer 6 is made of a conductive material such as a metal, and may be made of copper (Cu).

According to the embodiment, the sublayer 6 is formed such that adjacent ones of the overhang portions 62a touch each other. The other features of the sublayer 6 are the same as those of the first embodiment.

Figure 16:
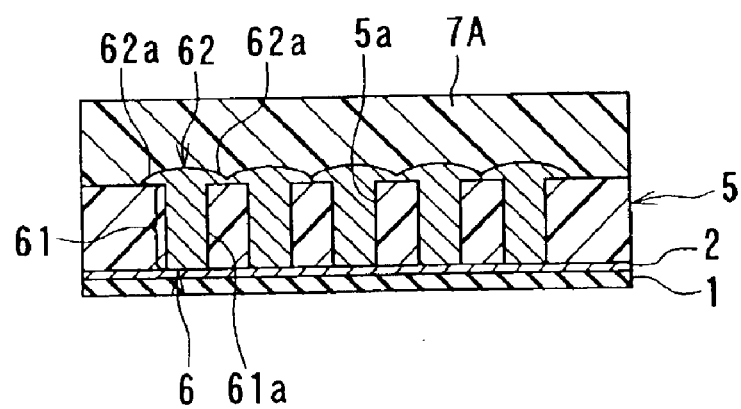
FIG. 16 is a cross section for illustrating a step that follows FIG. 15.

Next, as shown in FIG. 16, the coating film 7A is formed on the frame 5 and the sublayer 6. A method and a material of which the coating film 7A is formed are the same as those of the first embodiment.

Figure 17:
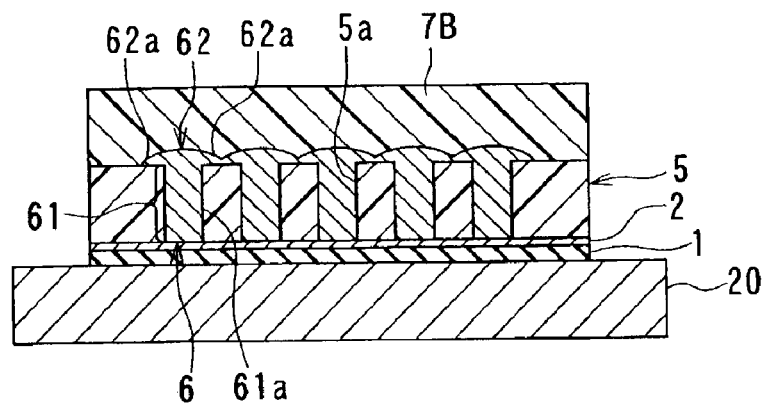
FIG. 17 is a cross section for illustrating a step that follows FIG. 16.

FIG. 17 illustrates the following step. In the step, to evaporate the solvent contained in the coating film 7A and to enhance the intimate contact between the coating film 7A and the layer below, heat processing at a specific temperature for a specific period of time is performed, that is, prebaking is performed on the coating film 7A. The second resist layer 7B is thereby formed. FIG. 17 shows an example in which the above-mentioned heat processing is performed, using the hot plate 20. Alternatively, heat processing may be performed through other methods such as the one using an infrared heater.

Figure 18:
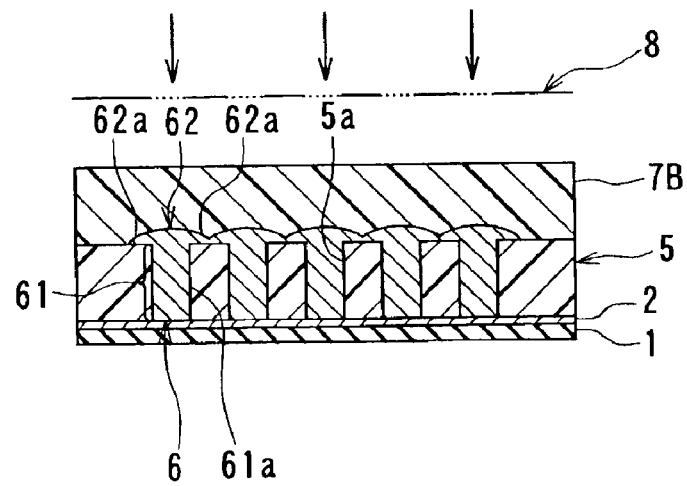
FIG. 18 is a cross section for illustrating a step that follows FIG. 17.

Next, as shown in FIG. 18, the resist layer 7B is exposed through the mask 8 to form a latent image corresponding to the pattern of the mask 8 on the resist layer 7B. Next, heat processing, that is, pre-development baking is performed on the resist layer 7B as required. The mask 8 has a pattern the same as that of the first embodiment.

Figure 19:
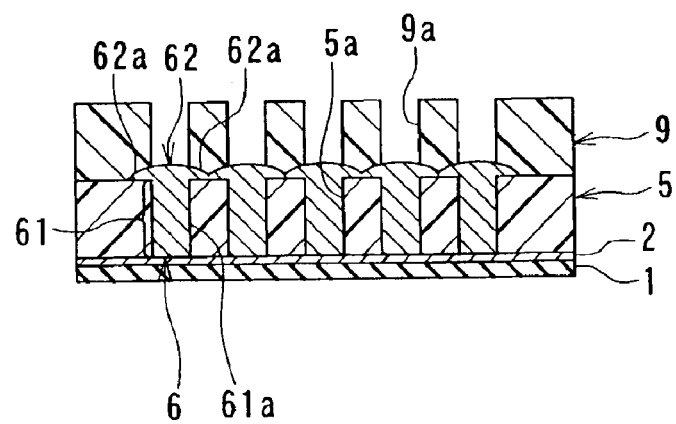
FIG. 19 is a cross section for illustrating a step that follows FIG. 18.

FIG. 19 illustrates the following step. In the step the resist layer 7B is developed with a developer and washed with water and dried. The second frame 9 for forming the second sublayer is thereby made of the remaining resist layer 7B. The second frame 9 has the groove 9a. FIG. 19 shows an example in which the liquid resist used for making the resist layer 7B is positive, and the portions of the resist layer 7B exposed are thus removed after development.

In such a manner the resist layer 7B is patterned by photolithography and the frame 9 is formed.

Figure 20:
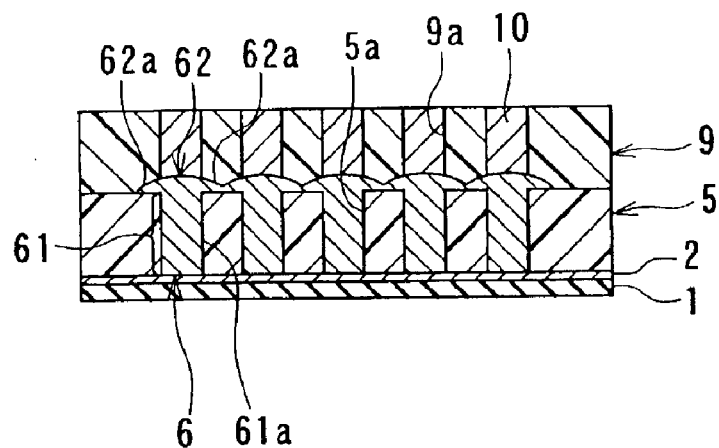
FIG. 20 is a cross section for illustrating a step that follows FIG. 19.

Next, pre-plating processing is performed as required, which is followed by feeding a current to the electrode film 2 to perform electroplating through the use of the frame 9. The second sublayer 10 is thereby formed in the groove 9a of the frame 9, as shown in FIG. 20. The sublayer 10 is stacked on the second portion 62 of the first sublayer 6. The sublayer 10 is made of a conductive material such as a metal, and may be made of copper (Cu).

In the step of forming the sublayer 10, the sublayer 10 may be formed to have a thickness smaller than or equal to the thickness of the frame 9. Alternatively, the sublayer 10 may be formed to have a thickness greater than the thickness of the frame 9, and formed such that portions of the sublayer 10 extend out of the groove 9a and hang over the top surface of the frame 9, as the sublayer 6 is formed.

Figure 21:
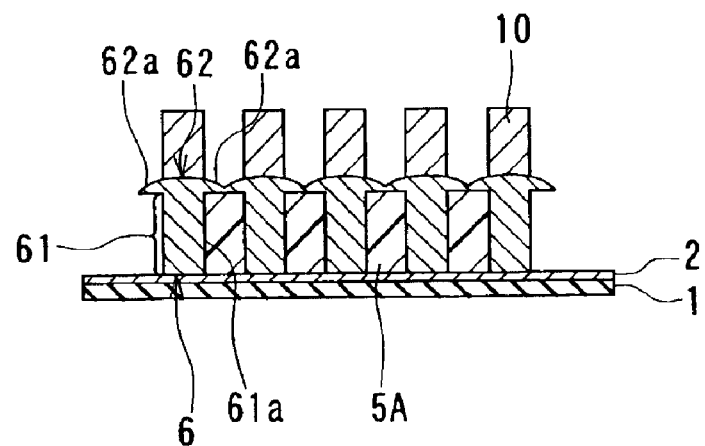
FIG. 21 is a cross section for illustrating a step that follows FIG. 20.

Next, the layered structure of FIG. 20 is soaked in an organic solvent and shaken, for example, so as to dissolve and remove the entire second frame 9 and part of the first frame 5, as shown in FIG. 21. At this point, portions of the first frame 5 whose top surfaces are completely covered with the overhang portions 62a are left. These portions will be hereinafter called remainders 5A.

Figure 22:
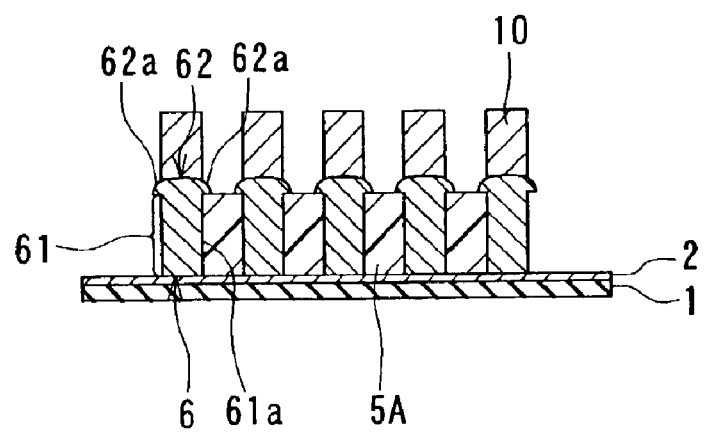
FIG. 22 is a cross section for illustrating a step that follows FIG. 21.

Next, as shown in FIG. 22, at least portions of the overhang portions 62a are removed by wet etching, or dry etching such as ion milling or reactive ion etching, using the sublayer 10 as a mask, so as to separate adjacent ones of the overhang portions 62a from each other.

Figure 23:
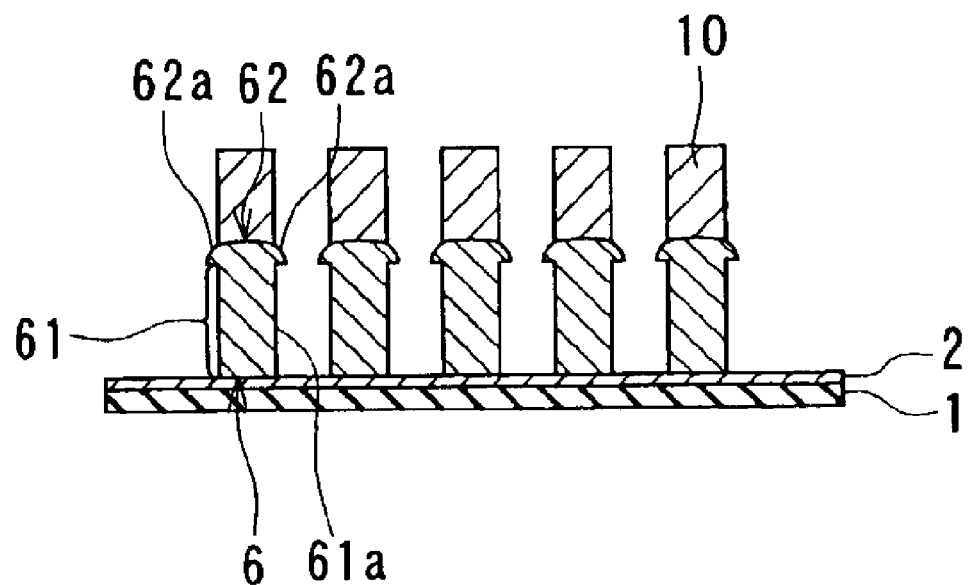
FIG. 23 is a cross section for illustrating a step that follows FIG. 22.

Next, the layered structure of FIG. 22 is soaked in an organic solvent and shaken, for example, so as to dissolve and remove the remainders 5A, as shown in FIG. 23.

Figure 24:
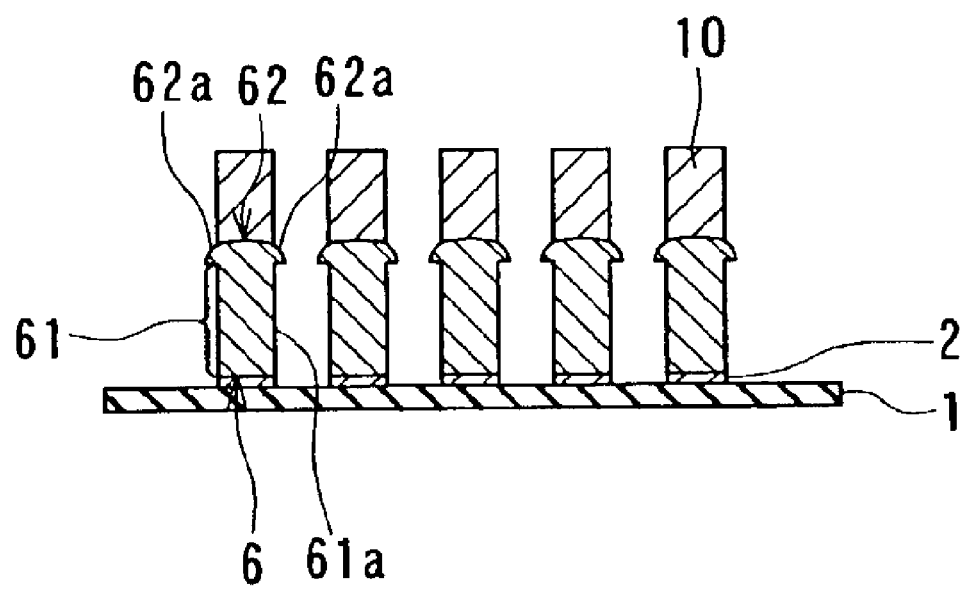
FIG. 24 is a cross section for illustrating a step that follows FIG. 23.

Finally, as shown in FIG. 24, portions of the electrode film 2 except the portion below the first sublayer 6 are removed by wet etching, or dry etching such as ion milling or reactive ion etching, using the sublayers 6 and 10 as masks. The patterned thin film having the stacked two sublayers 6 and 10 each formed by frame plating is thereby formed.

An example of the method of forming the patterned thin film of the second embodiment will now be described. This example includes the same steps as those of the example of the first embodiment up to the step of forming the first frame 5.

In the following step of the example of the second embodiment, electroplating was performed, using the frame 5, to form the first sublayer 6 of Cu. A cupric sulfate bath that is typically used for plating of Cu was employed as a plating bath. In this example the sublayer 6 had a thickness of 70 $\mu$m. Portions of the sublayer 6 extended out of the groove 5a and hanged over the top surface of the frame 5. In addition, adjacent ones of the overhang portions 62a were made to touch each other.

The following steps from the step of forming the coating film 7A to the step of forming the sublayer 10 were the same as those of the example of the first embodiment.

In the following step of the example of the second embodiment the layered structure including the sublayers 6 and 10 was soaked in acetone and shaken to dissolve and remove the entire second frame 9 and part of the first frame 5.

Next, portions of the overhang portions 62a were selectively etched under the following conditions, using an ion-milling apparatus, to separate adjacent ones of the overhang portions 62a from each other. The ion-milling apparatus utilized was the 8C (the product name) manufactured by Commonwealth Scientific Corporation. The output of the apparatus was 500 W and 500 mA. The pressure in the etching chamber was 3 mTorr (approximately 0.399 Pa). The angle at which ions were applied was 0 degree (the direction of ion application orthogonal to the substrate).

Next, the layered structure including the sublayers 6 and 10 was soaked in acetone and shaken to dissolve and remove the remainders 5A.

Next, portions of the electrode film 2 except the portion below the first sublayer 6 were etched and removed under the conditions the same as those of the example of the first embodiment.

As thus described, a 10-turn thin-film coil that was made up of the sublayers 6 and 10 and that had a pitch of 70 $\mu$m and a thickness of 120 $\mu$m was obtained.

The remainder of configuration, functions and effects of the second embodiment are similar to those of the first embodiment.

The present invention is not limited to the foregoing embodiments but may be practiced in still other ways. For example, the invention is applicable to formation of a patterned thin film having stacked three sublayers or more, each of which is formed by frame plating.

The following is a generalized description of the invention including a case of forming a patterned thin film having stacked three sublayers or more, each of which is formed by frame plating. The method of the invention is a method of forming a patterned thin film containing stacked sublayers whose number is M (where M is an integer that is two or greater), and the method comprises the steps of forming the respective sublayers by frame plating from the first sublayer to the $M^{th}$ sublayer one by one. Each of these steps includes: the step of forming the coating film by applying a liquid resist to the layer below; the heat processing step of forming the resist layer by performing heat processing on the coating film; the step of forming the frame having the groove by patterning the resist layer; and the plating step of forming the sublayer by plating through the use of the frame. In the plating step of the step of forming the $N^{th}$ sublayer, where N is an integer that is one or greater, and is (M−1) or smaller, the sublayer is formed to have the first portion and the second portion. The first portion is encased in the groove and has the sidewall. The second portion extends out of the groove and is coupled to the first portion. The second portion has the overhang portions that overhang and extend more outward than the sidewall of the first portion.

In the plating step of the step of forming the $N^{th}$ sublayer, the sublayer may be formed such that adjacent ones of the overhang portions are kept from being contact with each other. Alternatively, in the plating step of the step of forming the $N^{th}$ sublayer, the sublayer may be formed such that adjacent ones of the overhang portions are in contact with each other. Furthermore, the step of forming the $N^{th}$ sublayer may include the step of removing at least part of the overhang portions so that adjacent ones of the overhang portions are separated from each other after the plating step.

The patterned thin film of the invention comprises sublayers whose number is M where M is an integer that is two or greater, the sublayers being stacked one by one from the first sublayer to the $M^{th}$ sublayer. The $N^{th}$ sublayer, where N is an integer that is one or greater, and (M−1) or smaller, includes the first portion having the sidewall and the second portion coupled to an end of the first portion near the $(N+1)^{th}$ sublayer. The second portion has the overhang portions that overhang and extend more outward than the sidewall of the first portion.

The invention is not limited to the thin-film inductor illustrated in the first embodiment but may be applied to formation of patterned thin films of other microdevices such as a thin-film magnetic head, a semiconductor device, a sensor incorporating thin films, and an actuator incorporating thin films. The patterned thin film is not limited to a coil but may be wiring and so on.

According to the method of forming the patterned thin film of the invention as thus described, the $N^{th}$ sublayer is formed to include: the first portion having the sidewall and encased in the groove of the frame; and the second portion coupled to the first portion and extending out of the groove. The second portion has the overhang portions that overhang and extend more outward than the sidewall of the first portion. As a result, according to the invention, it is possible to prevent the coating film or the frame therebelow from forming foams during the heat processing step of the step of forming the $(N+1)^{th}$ sublayer. It is therefore possible to form the patterned thin film small in width and great in thickness, employing frame plating.

According to the patterned thin film of the invention, the $N^{th}$ sublayer includes the first portion having the sidewall and the second portion coupled to an end of the first portion near the $(N+1)^{th}$ sublayer. The second portion has the overhang portions that overhang and extend more outward than the sidewall of the first portion. As a result, according to the invention, it is possible to make the resist layer without defects that is used for forming the $(N+1)^{th}$ sublayer through the use of frame plating. It is therefore possible to form the patterned thin film small in width and great in thickness, employing frame plating.

Obviously many modifications and variations of the present invention are possible in the light of the above teachings. It is therefore to be understood that within the scope of the appended claims the invention may be practiced otherwise than as specifically described.

What is claimed is:

1. A method of forming a thin-film coil containing stacked sublayers whose number is M where M is an integer that is two or greater, the method comprising the steps of forming the respective sublayers by frame plating from a first sublayer to an $M^{th}$ sublayer one by one, each sublayer being spiral shaped, each of the steps including:

the step of forming a coating film by applying a liquid resist to a layer below;

the heat processing step of forming a resist layer by performing heat processing on the coating film;

the step of forming a frame having a groove by patterning the resist layer; and the plating step of forming each of the sublayers by plating through the use of the frame, wherein, in the plating step of the step of forming an $N^{th}$ sublayer where N is an integer that is one or greater, and is (M−1) or smaller, the sublayer is formed to include: a first portion having a sidewall and encased in the groove; and a second portion extending out of the groove and coupled to the first portion, the second portion having overhang portions that overhang and extend more outward than the sidewall of the first portion.

2. The method according to claim 1, wherein the sublayer is formed such that adjacent ones of the overhang portions are kept from being in contact with each other in the plating step of the step of forming the $N^{th}$ sublayer.

3. The method according to claim 1, wherein:

the sublayer is formed such that adjacent ones of the overhang portions are in contact with each other in the plating step of the step of forming the $N^{th}$ sublayer; and the step of forming the $N^{th}$ sublayer further includes the step of removing at least part of the overhang portions by etching so that adjacent ones of the overhang portions are separated from each other after the plating step.

4. A thin-film coil comprising sublayers whose number is M where M is an integer that is two or greater, the sublayers being stacked on a substrate one by one from a first sublayer to an $M^{th}$ sublayer, each sublayer being spiral shaped, wherein:

an $N^{th}$ sublayer, where N is an integer that is one or greater, and is (M−1) or smaller, includes:

a first portion having a sidewall; and a second portion coupled to an end of the first portion near an $(N+1)^{th}$ sublayer;

the second portion includes overhang portions that overhang and extend more outward than the sidewall of the first portion; and the first portion of the first sublayer is located on the substrate.

\* \* \* \* \*